United States Patent
Maeta et al.

(10) Patent No.: US 9,466,518 B2
(45) Date of Patent: Oct. 11, 2016

(54) ELECTROSTATIC CHUCK DEVICE
(71) Applicant: Sumitomo Osaka Cement Co., Ltd., Tokyo (JP)
(72) Inventors: Shinichi Maeta, Tokyo (JP); Mamoru Kosakai, Tokyo (JP); Yukio Miura, Tokyo (JP); Takeshi Otsuka, Tokyo (JP)
(73) Assignee: Sumitomo Osaka Cement Co., Ltd., Tokyo (JP)
( * ) Notice: Subject to any disclaimer, the term of this patent is extended or adjusted under 35 U.S.C. 154(b) by 140 days.
(21) Appl. No.: 14/286,898
(22) Filed: May 23, 2014
(65) Prior Publication Data
US 2014/0355169 A1    Dec. 4, 2014
(30) Foreign Application Priority Data
May 31, 2013 (JP) ................................. 2013-115394
(51) Int. Cl.
| H05F 3/00 | (2006.01) |
|---|---|
| H01L 21/683 | (2006.01) |
| H01L 21/67 | (2006.01) |
| H01L 21/687 | (2006.01) |
| G03F 7/20 | (2006.01) |
| H01J 37/32 | (2006.01) |

(52) U.S. Cl.
CPC ..... *H01L 21/6831* (2013.01); *H01L 21/67109* (2013.01); *H01L 21/6875* (2013.01); *H01L 21/68735* (2013.01); *G03F 7/707* (2013.01); *G03F 7/70708* (2013.01); *H01J 37/32715* (2013.01)

(58) Field of Classification Search
USPC .................................................. 361/234, 233
See application file for complete search history.

(56) References Cited
U.S. PATENT DOCUMENTS

2006/0011610 A1* 1/2006 Kondou ................. H05B 3/143
219/444.1

2006/0209490 A1* 9/2006 Nakamura ........ H01L 21/67288
361/234

FOREIGN PATENT DOCUMENTS

| JP | 2009-111243 A | 5/2009 |
|---|---|---|
| JP | 4739039 B | 8/2011 |
| JP | 4909424 B | 4/2012 |
| JP | 4942364 B | 5/2012 |

* cited by examiner

*Primary Examiner* — Danny Nguyen
(74) *Attorney, Agent, or Firm* — Wood, Herron & Evans, LLP

(57) ABSTRACT

An electrostatic chuck device is provided in which there is no concern that a plate-shaped sample may be deformed when adsorbing the plate-shaped sample or when detaching the plate-shaped sample, the temperature of the plate-shaped sample is uniformized, and particles are not easily produced.

In an electrostatic chuck device 1 provided with an electrostatic chuck section 2 which has a placement plate 11, an upper surface 11*a* of which is a placement surface on which a plate-shaped sample W such as a semiconductor wafer is placed, a support plate 12 integrated with the placement plate 11, and an internal electrode for electrostatic adsorption 13 and an insulating material layer 14 which are provided between the placement plate 11 and the support plate 12, an annular projection portion 21 is provided at a peripheral border portion on the upper surface 11*a*, a plurality of projection portions 22 having the same height as the height of the annular projection portion 21 are provided in an area surrounded by the annular projection portion 21 of the upper surface 11*a*, and an upper end portion of the annular projection portion 21 and an upper end portion of each of the plurality of projection portions 22 are located on a concave surface 23 with a central portion of the upper surface 11*a* as a basal plane.

8 Claims, 3 Drawing Sheets

# ELECTROSTATIC CHUCK DEVICE

BACKGROUND OF THE INVENTION

1. Field of the Invention

The present invention relates to an electrostatic chuck device and more specifically, to an electrostatic chuck device which is suitably used when adsorbing and fixing a plate-shaped sample such as a semiconductor wafer or a glass substrate for a liquid crystal device by an electrostatic force and in which even in various processes such as film formation treatment by a physical vapor deposition method (PVD) or a chemical vapor deposition method (CVD), etching treatment such as plasma etching, and exposure treatment in a semiconductor manufacturing process, wear resistance is high and it is possible to control the plate-shaped sample to have a desired temperature.

Priority is claimed on Japanese Patent Application No. 2013-115394, filed May 31, 2013, the content of which is incorporated herein by reference.

2. Description of Related Art

In the past, in a manufacturing process of a semiconductor device, a liquid crystal device, or the like, applying various treatments to the surface of a plate-shaped sample such as a semiconductor wafer, a metal wafer, or a glass substrate has been performed, and at the time of various treatments, an electrostatic chuck device has been used in order to fix the plate-shaped sample by an electrostatic adsorption force and maintain the plate-shaped sample at a preferable constant temperature.

The electrostatic chuck device has, as an essential component, an electrostatic chuck section with an internal electrode for electrostatic adsorption provided in the inside or the lower surface of a ceramic plate-shaped body that is a dielectric body, and the plate-shaped sample such as a semiconductor wafer, a metal wafer, or a glass substrate is placed on the surface (adsorption surface) of the ceramic plate-shaped body and is adsorbed and fixed onto the adsorption surface of the ceramic plate-shaped body by an electrostatic adsorption force which is generated by applying a voltage between the plate-shaped sample and the internal electrode for electrostatic adsorption.

In such an electrostatic chuck device, there is a device to cool the plate-shaped sample by making inert gas such as helium gas flow between the adsorption surface of a ceramic plate-shaped body and the plate-shaped sample for the purpose of controlling the temperature of the plate-shaped sample being processed or being treated, and various improvements for improving various characteristics such as the sealing characteristics of the inert gas or the detachment characteristics of the plate-shaped sample such as a wafer have been performed.

For example, an electrostatic chuck is proposed in which variation in the temperature of a substrate to be treated, which is caused by contact unevenness in a seal ring, does not occur due to providing the seal ring at a peripheral border portion of a placement surface on which the substrate to be treated is placed, of a base material, providing a plurality of projection portions having the same height as the height of the seal ring, in an area surrounded by the seal ring of the placement surface, and determining an arrangement pitch of a plurality of projections and a positional relationship between the projection closest to the seal ring and the seal ring (Japanese Unexamined Patent Application, First Publication No. 2009-111243).

Further, an electrostatic chuck is proposed in which the detachment characteristics of a wafer or the amount of leakage of gas is improved by providing an annular convex portion at an outer peripheral end portion of a placement surface on which the wafer is placed, of a base material, providing an annular concave portion inside the annular convex portion, providing a smooth concave surface inside the annular concave portion, and defining a positional relationship between the annular convex portion and the annular concave portion and average roughness Ra of a contact surface with a plate-shaped sample, for example, making a contact surface of the annular convex portion protrude higher than the concave surface, or the like (Japanese Patent No. 4942364).

Further, in order to make heat conduction of a plate-shaped sample uniform, it is necessary to reduce a contact area between the plate-shaped sample and a base material on which the plate-shaped sample is placed, and therefore, reducing the contact area by forming projections on a placement surface of the base material is performed.

As electrostatic chucks, an electrostatic chuck of a type in which the electrical resistivity of a dielectric layer is set to be in a range of $1 \times 10^8$ $\Omega \cdot cm$ to $1 \times 10^{12}$ $\Omega \cdot cm$, thereby performing adsorption by a Johnsen-Rahbek force, and an electrostatic chuck of a type in which the electrical resistivity of a dielectric layer is set to be greater than or equal to $1 \times 10^{14}$ $\Omega \cdot cm$, thereby performing adsorption by a Coulomb's force are known.

Incidentally, in a case where a contact area with a wafer is reduced in a Johnsen-Rahbek force type electrostatic chuck, an electric current is concentrated on a contact portion, and therefore, a problem such as heat generation or non-uniformity of plasma occurs.

Therefore, an electrostatic chuck device is proposed in which a contact area with a wafer is reduced by using an aluminum oxide-silicon carbide composite sintered body that is a dielectric body having a high adsorption force in a Coulomb's force, for a material of a base material on which a plate-shaped sample is placed, and providing minute projection portions on an electrostatic adsorption surface of the base material (Japanese Patent No. 4739039).

Further, an electrostatic chuck device is proposed in which flip-up of a wafer or the uniformity of temperature is improved by providing concentric annular projections at an outer peripheral border portion of a placement surface of a base material, on which a plate-shaped sample is placed, and inside thereof, and making the height of the inner annular projection higher than the height of the outer annular projection (Japanese Patent No. 4909424).

SUMMARY OF THE INVENTION

Incidentally, in the electrostatic chuck described in Japanese Unexamined Patent Application, First Publication No. 2009-111243, although it is possible to prevent a lift of a wafer at the outer peripheral portion due to undulation of the wafer, there is a problem in that it is difficult to enhance the effect of sealing the wafer.

Further, in the electrostatic chuck described in Japanese Patent No. 4942364, since the wafer is warped by making the height of a seal ring portion of an outer periphery higher than the height of a gas filling surface, although it is possible to enhance gas sealing characteristics or detachment characteristics, the thickness of a gas sealing layer is not constant in the placement surface of the electrostatic chuck, and therefore, there is a problem in that variation occurs in heat transfer between the electrostatic chuck and the wafer. Further, since the electrostatic chuck is a Johnson-Rahbek force type electrostatic chuck, in order to obtain a sufficient adsorption force, it is necessary to widen the contact area with the wafer, and therefore, there is a problem in that it is not possible to sufficiently utilize cooling characteristics of sealing gas.

Further, in the electrostatic chuck device described in Japanese Patent No. 4739039, since cooling gas is made to flow between the base material having the minute projection portions and the wafer, there are problems in that the amount of leakage of gas from an outer peripheral portion does not become constant in a plane, and thermal uniformity is lowered, and thus plasma becomes unstable.

Further, in the electrostatic chuck device described in Japanese Patent No. 4909424, although it is possible to improve flip-up of the wafer or the uniformity of temperature by making the height of the inner annular projection higher than the height of the outer annular projection, since the thickness of a sealing layer is different between a central portion and an outer peripheral portion, there is a problem in that heat transfer is different between the central portion and the outer peripheral portion. Further, if the wafer placement surface is made into a concave shape, the wafer is deformed at the time of adsorption or detachment, and accordingly, a contact surface between the placement surface and the lower surface of the wafer is scraped, and thus there is a problem in that particles are easily produced.

The present invention has been made in view of the above-described circumstances and has an object to provide an electrostatic chuck device in which there is no concern that a plate-shaped sample may be deformed when adsorbing the plate-shaped sample or when detaching the plate-shaped sample, the temperature of the plate-shaped sample is uniformized, and particles are not easily produced.

The inventors of the present invention have found, as a result of performing intensive studies in order to solve the above-described problems, that if a configuration is made in which an annular projection portion is provided at a peripheral border portion on one principal surface of a base material, a plurality of projection portions having the same height as the height of the annular projection portion are provided in an area surrounded by the annular projection portion on the one principal surface, and an upper end portion of the annular projection portion and upper end portions of the plurality of projection portions are located on a concave surface with a central portion of the one principal surface as a basal plane, there is no concern that a plate-shaped sample may be deformed when adsorbing the plate-shaped sample or when detaching the plate-shaped sample, the temperature of the plate-shaped sample is also uniformized, and particles are not easily produced, and have completed the present invention.

That is, according to an aspect of the invention, there is provided an electrostatic chuck device including: an electrostatic chuck section which has a base material having one principal surface as a placement surface on which a plate-shaped sample is placed, and an internal electrode for electrostatic adsorption that electrostatically adsorbs the plate-shaped sample to the placement surface, in which an annular projection portion is provided at a peripheral border portion on the one principal surface, a plurality of projection portions having the same height as the height of the annular projection portion are provided in an area surrounded by the annular projection portion on the one principal surface, and an upper end portion of the annular projection portion and upper end portions of the plurality of projection portions are located on a concave surface with a central portion of the one principal surface as a basal plane.

In this electrostatic chuck device, due to a configuration in which the annular projection portion is provided at the peripheral border portion on the one principal surface of the base material, the plurality of projection portions having the same height as the height of the annular projection portion are provided in the area surrounded by the annular projection portion on the one principal surface, and the upper end portion of the annular projection portion and the upper end portions of the plurality of projection portions are located on the concave surface with the central portion of the one principal surface as a basal plane, the contact of the plate-shaped sample with the annular projection portion and the plurality of projection portions is reliably performed at the entire surface of the plate-shaped sample, and accordingly, there is no concern that the plate-shaped sample may be deformed when adsorbing the plate-shaped sample or when detaching the plate-shaped sample, and the temperature of the plate-shaped sample is uniformized.

Further, the plate-shaped sample is supported in a close contact state by the upper end portion of the annular projection portion and the upper end portions of the plurality of projection portions, whereby there is no concern that a contact surface between these upper end portions and the plate-shaped sample may be scraped, and thus particles are not easily produced.

In the electrostatic chuck device according to the present invention, a base section for cooling may be provided on the other principal surface side of the electrostatic chuck section, and a difference between a height from one principal surface of the base section for cooling of the annular projection portion and a height from one principal surface of the base section for cooling of the projection portion which is located in the vicinity of the center of the area may be greater than or equal to 1 μm and less than or equal to 30 μm.

In this electrostatic chuck device, due to a configuration in which the difference between the height from one principal surface of the base section for cooling of the annular projection portion and the height from one principal surface of the base section for cooling of the projection portion which is located in the vicinity of the center of the area surrounded by the annular projection portion is greater than or equal to 1 μm and less than or equal to 30 μm, even when fixing the electrostatic chuck section to the base section for cooling by a fixture such as a bolt, a state where the one principal surface of the base material is deformed or is upward convex is not created, and thus stable characteristics are obtained. Further, excessive deformation or the like does not easily occur when the plate-shaped sample is electrostatically adsorbed, and thus a defect such as breakage of the plate-shaped sample is prevented.

In the electrostatic chuck device according to the present invention, the sum of an area of the upper end portion of the annular projection portion and the total area of areas of the respective upper end portions of the plurality of projection portions may be less than or equal to 30% of an area of the one principal surface.

In this electrostatic chuck device, due to a configuration in which the sum of the area of the upper end portion of the annular projection portion and the total area of the areas of the respective upper end portions of the plurality of projection portions is less than or equal to 30% of the area of the one principal surface, the ratio of the total area of a flow path of a medium for sealing to the area of the one principal surface is increased, thermal uniformity due to the medium for sealing is improved, and the leakage quantity (the amount of leakage) of the medium for sealing is reduced. Accordingly, the generation of plasma is stabilized.

In the electrostatic chuck device according to the present invention, the base material may be made of a ceramic in which electrical resistivity is greater than or equal to $1 \times 10^{14}$ Ω·cm and a relative dielectric constant at a frequency of 20 Hz is greater than or equal to 13.

In this electrostatic chuck device, due to a configuration in which the base material is made of a ceramic in which electrical resistivity is greater than or equal to $1 \times 10^{14}$ Ω·cm and a relative dielectric constant at a frequency of 20 Hz is greater than or equal to 13, even in a case where a contact area between the base material and the plate-shaped sample is small, it becomes possible to obtain a high adsorption force, and it becomes possible to reliably bring the plate-shaped sample into contact with the upper end portion of the annular projection portion and the upper end portion of each of the plurality of projection portions, which are located on the concave surface with the central portion of the one principal surface of the base material as a basal plane. Accordingly, the temperature of the plate-shaped sample is uniformized, the leakage quantity (the amount of leakage) of the medium for sealing is reduced, and plasma is stabilized.

In the electrostatic chuck device according to the present invention, a particle size of the ceramic may be less than or equal to 2 μm.

In this electrostatic chuck device, due to a configuration in which the particle size of the ceramic is set to be less than or equal to 2 μm, the generation of particles due to scraping between the plate-shaped sample and the annular projection portion and the plurality of projection portions, which occurs with the deformation of the plate-shaped sample at the time of adsorption, is suppressed by using the ceramic having a small particle size.

Further, it becomes possible to make the thickness of the annular projection portion and the sizes of the plurality of projection portions small, and accordingly, it becomes possible to reduce a contact area between the annular projection portion and the plurality of projection portions and the plate-shaped sample.

In the electrostatic chuck device according to the present invention, one or more minute projection portions may be provided at the upper end portion of the annular projection portion.

In this electrostatic chuck device, due to a configuration in which one or more minute projection portions are provided at the upper end portion of the annular projection portion, it becomes possible to make a certain amount of medium for sealing flow even onto the annular projection portion, and thus the temperature of the outermost peripheral portion of the plate-shaped sample is uniformized.

Further, even in a case where particles enter between the annular projection portion and the plate-shaped sample, the particles fall under the minute projection portions, and thus a change in flow rate of the medium for sealing due to the particles is prevented. In this way, the temperature of the plate-shaped sample is stably and uniformly maintained, the leakage quantity (the amount of leakage) of the medium for sealing is reduced, and plasma is stabilized.

According to the electrostatic chuck device related to the present invention, since a configuration is made in which the annular projection portion is provided at the peripheral border portion on the one principal surface on which the plate-shaped sample, of the base material, is placed, the plurality of projection portions having the same height as the height of the annular projection portion are provided in the area surrounded by the annular projection portion on the one principal surface, and the upper end portion of the annular projection portion and the upper end portions of the plurality of projection portions are located on the concave surface with the central portion of the one principal surface as a basal plane, there is no concern that the plate-shaped sample may be deformed when adsorbing the plate-shaped sample or when detaching the plate-shaped sample, and thus it is possible to uniformize the temperature of the plate-shaped sample.

Further, since the plate-shaped sample is supported in a close contact state by the upper end portion of the annular projection portion and the upper end portions of the plurality of projection portions, there is no concern that a contact surface between these upper end portions and the plate-shaped sample may be scraped, and thus it is possible to make it difficult for particles to be produced.

If a difference between the height from the other principal surface of the base material of the annular projection portion and the height from the other principal surface of the base material of the projection portion which is located in the vicinity of the center of the one principal surface is set to be greater than or equal to 1 μm and less than or equal to 30 μm, even when fixing the electrostatic chuck section by a fixture such as a bolt, a state where the one principal surface of the base material is deformed or is upward convex is not created, and thus it is possible to obtain stable characteristics. Further, even when the plate-shaped sample is electrostatically adsorbed, it is possible to make it difficult for excessive deformation or the like to occur, and thus it is possible to prevent a defect such as breakage of the plate-shaped sample.

If the sum of the area of the upper end portion of the annular projection portion and the total area of the areas of the respective upper end portions of the plurality of projection portions is set to be less than or equal to 30% of the area of the one principal surface, it is possible to increase the ratio of the total area of the flow path of the medium for sealing to the area of the one principal surface, and thus it is possible to improve thermal uniformity due to the medium for sealing. Accordingly, it is possible to reduce the leakage quantity (the amount of leakage) of the medium for sealing, and it is possible to stabilize the generation of plasma.

If the base material is made of a ceramic in which electrical resistivity is greater than or equal to $1 \times 10^{14}$ Ω·cm and a relative dielectric constant at a frequency of 20 Hz is greater than or equal to 13, it is possible to reliably bring the plate-shaped sample into contact with the upper end portion of the annular projection portion and the upper end portions of the plurality of projection portions, which are located on the concave surface with the central portion of the one principal surface of the base material as a basal plane, and thus it is possible to uniformize the temperature of the plate-shaped sample. Further, it is possible to reduce the leakage quantity (the amount of leakage) of the medium for sealing, and it is possible to stabilize plasma.

If the particle size of the ceramic is set to be less than or equal to 2 μm, it is possible to suppress the generation of particles due to scraping between the plate-shaped sample and the annular projection portion and the plurality of projection portions, which occurs with the deformation of the plate-shaped sample at the time of adsorption. Further, since it becomes possible to make the thickness of the annular projection portion and the sizes of the plurality of projection portions small, it becomes possible to reduce a contact area between the annular projection portion and the plurality of projection portions and the plate-shaped sample.

If one or more minute projection portions are provided at the upper end portion of the annular projection portion, it is possible to make a certain amount of medium for sealing flow even onto the annular projection portion, and thus it is possible to uniformize the temperature of the outermost peripheral portion of the plate-shaped sample.

Further, even in a case where particles enter between the annular projection portion and the plate-shaped sample, the particles fall under the minute projection portions, and thus there is no concern that the flow rate of the medium for sealing may change due to the particles. Accordingly, it is possible to stably and uniformly maintain the temperature of the plate-shaped sample, it is possible to reduce the leakage quantity (the amount of leakage) of the medium for sealing, and it is possible to stabilize plasma.

DETAILED DESCRIPTION OF THE INVENTION

Embodiments for carrying out an electrostatic chuck device according to the present invention will be described based on the drawings.

In addition, these embodiments are intended to be specifically described for better understanding of the gist of the present invention and are not intended to limit the present invention unless otherwise specified.

In addition, in these embodiments, in order to clarify the features of the invention, constituent elements corresponding to the features, of constituent elements, are shown with a shape and a size different from the actual shape and size.

[First Embodiment]

Figure 1:
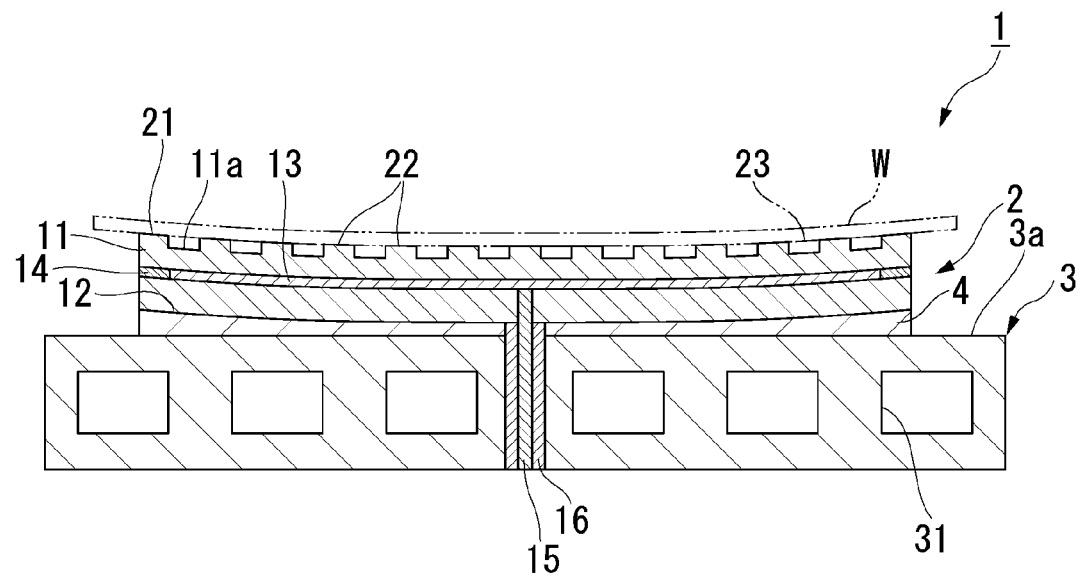
FIG. 1 is a cross-sectional view showing an electrostatic chuck device according to a first embodiment of the present invention.
Figure 2:
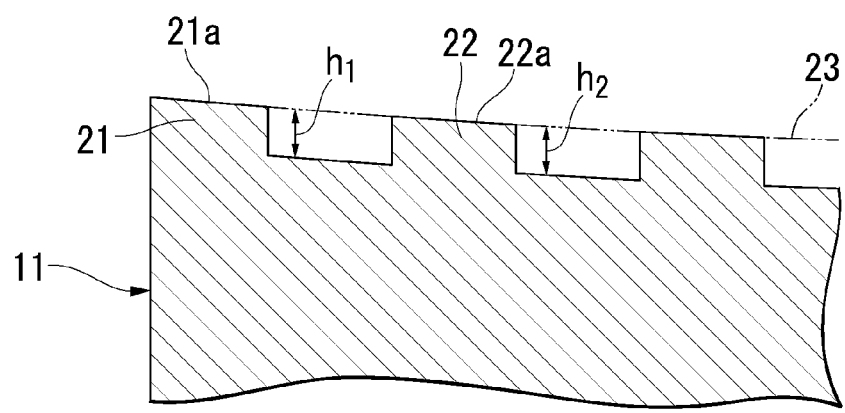
FIG. 2 is a partially enlarged cross-sectional view showing the vicinity of a peripheral border portion of an electrostatic chuck section of the electrostatic chuck device according to the first embodiment of the present invention.

FIG. 1 is a cross-sectional view showing an electrostatic chuck device according to a first embodiment of the present invention, and FIG. 2 is a partially enlarged cross-sectional view showing the vicinity of a peripheral border portion of an electrostatic chuck section of the electrostatic chuck device.

An electrostatic chuck section 1 is configured to mainly include an electrostatic chuck section 2 having a disk shape, a base section for cooling 3 having a disk shape with a thickness, which cools the electrostatic chuck section 2 to a desired temperature, and an organic adhesive layer 4 which bonds and integrates the electrostatic chuck section 2 and the base section for cooling 3.

The electrostatic chuck section 2 is configured to include a placement plate (a base material) 11, the upper surface (one principal surface) of which is a placement surface on which a plate-shaped sample W such as a semiconductor wafer is placed, a support plate 12 which is integrated with the placement plate 11 and supports the placement plate 11, an internal electrode for electrostatic adsorption 13 provided between the placement plate 11 and the support plate 12, an insulating material layer 14 which isolates the periphery of the internal electrode for electrostatic adsorption 13, and a terminal for power feeding 15 which is provided so as to pass through the support plate 12 and applies direct-current voltage to the internal electrode for electrostatic adsorption 13.

Then, at a peripheral border portion on a surface (one principal surface) 11a of the placement plate 11, an annular projection portion 21 having a rectangular cross-sectional shape is provided so as to go round the peripheral border portion, and in addition, in an area surrounded by the annular projection portion 21 on the surface 11a, a plurality of projection portions 22 each having the same height as the annular projection portion 21 and having a transverse cross-section of a circular shape and a vertical cross-section of a substantially rectangular shape are provided. Then, an upper end portion 21a of the annular projection portion 21 and an upper end portion 22a of each of the plurality of projection portions 22 are located on a concave surface 23, the basal plane of which is located at the center point of the surface 11a.

Next, the electrostatic chuck device 1 will be described in detail.

The electrostatic chuck section 2 is bent such that the entirety has a concave surface shape with a central portion as a basal plane, in a state where the placement plate 11, the support plate 12, the internal electrode for electrostatic adsorption 13, the insulating material layer 14, and the terminal for power feeding 15 are integrated with each other.

The placement plate 11 and the support plate 12 configuring principal sections of the electrostatic chuck section 2 have disk shapes in which the shapes of overlapping surfaces are the same, and are configured by a ceramic in which electrical resistivity is greater than or equal to $1 \times 10^{14}$ Ω·cm and a relative dielectric constant at a frequency of 20 Hz is greater than or equal to 13, preferably, is greater than or equal to 18.

Here, the reason for limiting the electrical resistivity of the placement plate 11 and the support plate 12 to greater than or equal to $1 \times 10^{14}$ Ω·cm and limiting the relative dielectric constant at a frequency of 20 Hz of the placement plate 11 and the support plate 12 to greater than or equal to 13 is because these ranges are ranges in which the temperature of the plate-shaped sample W is uniformized and the leakage quantity (the amount of leakage) of a medium for sealing is reduced, and thus plasma is stabilized.

Here, if the electrical resistivity is less than $1 \times 10^{14}$ Ω·cm, insulation properties as a base material become insufficient and breaking of a device formed on the plate-shaped sample W and poor detachment of the plate-shaped sample W with an increase in residual adsorption force occur due to an increase in leakage current to the plate-shaped sample W adsorbed, and therefore, it is not preferable.

Further, if the relative dielectric constant at a frequency of 20 Hz is less than 13, in a case where voltage is applied between the plate-shaped sample W and the internal electrode for electrostatic adsorption 13, it does not become possible to generate a sufficient electrostatic adsorption force for adsorbing the plate-shaped sample W, and as a result, it can become difficult to adsorb and fix the plate-shaped sample to the placement surface of the placement plate 11, and therefore, it is not preferable.

In addition, in the use in an etching device in which plasma is generated by a high frequency, in an aspect of having high-frequency permeability, it is preferable that a relative dielectric constant at greater than or equal to 1 MHz be small in comparison with a relative dielectric constant at 20 Hz.

As such a ceramic, an insulating ceramic having mechanical strength and having resistance to a corrosive gas and plasma thereof, such as an aluminum oxide-silicon carbide ($Al_2O_3$—SiC) composite sintered body, an aluminum oxide ($Al_2O_3$) sintered body, an aluminum nitride (AlN) sintered body, or yttrium oxide ($Y_2O_3$), is suitable.

It is preferable that the particle size of such a ceramic be less than or equal to 2 µm, and more preferably, the particle size be less than or equal to 1 µm.

In this manner, the particle size of the ceramic is set to be less than or equal to 2 µm, whereby the generation of particles due to scraping between the plate-shaped sample W and the annular projection portion 21 and the plurality of projection portions 22, which occurs with the deformation of the plate-shaped sample W at the time of adsorption, is suppressed by using the ceramic having a small particle size.

Further, it becomes possible to make the width and the height of the annular projection portion 21 and the height and the size of each of the plurality of projection portions 22 small, and accordingly, it becomes possible to reduce a contact area between the annular projection portion 21 and the plurality of projection portions 22 and the plate-shaped sample W.

On the other hand, in the annular projection portion 21 and the plurality of projection portions 22 provided on the surface 11a of the placement plate 11, the upper end portion 21a of the annular projection portion 21 and the upper end portion 22a of each of the plurality of projection portions 22 are located on the concave surface 23 with the central portion of the surface 11a as a basal plane, whereby the contact of the plate-shaped sample W with the annular projection portion 21 and the plurality of projection portions 22 is reliably performed at the entire surface of the plate-shaped sample W. Accordingly, there is no concern that the plate-shaped sample W may be deformed or the like when adsorbing the plate-shaped sample W or when detaching the plate-shaped sample W, and the temperature of the plate-shaped sample W is also uniformized.

The upper end portion 21a of the annular projection portion 21 and the upper end portion 22a of each of the plurality of projection portions 22 are located on the concave surface 23, whereby the plate-shaped sample W is supported in a close contact state on the annular projection portion 21 and the plurality of projection portions 22, and thus, a gap, scraping, or the like does not occur between the plate-shaped sample W and the annular projection portion 21 and the plurality of projection portions 22. Accordingly, particles are not easily produced.

In the annular projection portion 21, in order to make the amount of leakage when the plate-shaped sample W is positioned and sealed constant at the respective positions of an outer peripheral portion, it is preferable to set the surface roughness Ra of the upper end portion 21a to be greater than or equal to 0.001 µm and less than or equal to 0.050 µm.

In addition, it is preferable that the upper end portion 21a of the annular projection portion 21 and the upper end portion 22a of each of the plurality of projection portions 22 be within a height range of ±1 µm from the concave surface 23.

In this manner, the upper end portion 21a of the annular projection portion 21 and the upper end portion 22a of each of the plurality of projection portions 22 are set to be within a height range of ±1 µm from the concave surface 23, whereby the upper end portion 21a of the annular projection portion 21 and the upper end portion 22a of each of the plurality of projection portions 22 are located within a height range of ±1 µm on the concave surface 23, and thus contact between the upper end portions 21a and 22a and the plate-shaped sample W is more reliably made at the entire surface of the plate-shaped sample W, and accordingly, there is no concern that the plate-shaped sample W may be deformed when adsorbing the plate-shaped sample W or when detaching the plate-shaped sample W, and the temperature of the plate-shaped sample W is further uniformized.

In the annular projection portion 21 and the plurality of projection portions 22 provided on the surface (one principal surface) 11a of the placement plate 11, a height $h_1$ from the surface 11a to the upper end portion 21a of the annular projection portion 21 and a height $h_2$ from the surface 11a to the upper end portion 22a of each of the plurality of projection portions 22 are made to be the same. Then, areas excluding the annular projection portion 21 and the plurality of projection portions 22 of the surface 11a become flow paths making a medium for sealing such as nitrogen gas or helium gas flow therein.

In this manner, the height $h_1$ from the surface 11a to the upper end portion 21a of the annular projection portion 21 and the height $h_2$ from the surface 11a to the upper end portion 22a of each of the plurality of projection portions 22 are set to be the same, whereby the depths of the flow paths, which make the medium for sealing such as nitrogen gas or helium gas flow therein, surrounded by the annular projection portion 21 and the plurality of projection portions 22 on the surface 11a become constant. In this way, the heat transfer in the flow paths of the medium for sealing become constant, the temperature of the plate-shaped sample W is uniformized, and it becomes possible to stably generate plasma.

Further, it is preferable that a difference between a height from an upper surface (one principal surface) 3a of the base section for cooling 3 to the upper end portion 21a of the annular projection portion 21 and a height from the upper surface 3a to the upper end portion 22a of the projection portion 22 which is located in the vicinity of the center of the surface 11a be greater than or equal to 1 µm and less than or equal to 30 µm, and it is more preferable that the difference be greater than or equal to 5 µm and less than or equal to 15 µm.

In this manner, the difference between the height from the upper surface 3a of the base section for cooling 3 to the upper end portion 21a of the annular projection portion 21 and the height from the upper surface 3a to the upper end portion 22a of the projection portion 22 which is located in the vicinity of the center of the surface 11a is set to be greater than or equal to 1 µm and less than or equal to 30 µm, whereby even when fixing the electrostatic chuck section 2 to the base section for cooling 3 by a fixture such as a bolt, a state where the electrostatic chuck section 2 is deformed or is upward convex is not created, and thus stable characteristics are obtained.

Further, when the plate-shaped sample W is electrostatically adsorbed, excessive deformation or the like does not easily occur, and thus a defect such as breakage of the plate-shaped sample W is prevented.

It is preferable that the sum of the area of the upper end portion 21a of the annular projection portion 21 and the total area of the areas of the respective upper end portions 22a of the plurality of projection portions 22 be less than or equal to 30% of the area of the surface 11a, and it is more preferable that the sum be less than or equal to 25%.

Here, the sum of the area of the upper end portion 21a of the annular projection portion 21 and the total area of the areas of the respective upper end portions 22a of the plurality of projection portions 22 is set to be less than or equal to 30% of the area of the surface 11a, whereby it is possible to increase the ratio of the total area of the flow paths of the medium for sealing such as nitrogen gas or helium gas to the area of the surface 11a. Therefore, it is possible to improve thermal uniformity due to the medium for sealing.

As a result, it is possible to reduce the leakage quantity (the amount of leakage) of the medium for sealing, and thus it is possible to stabilize the generation of plasma.

It is preferable that the total thickness of the placement plate 11, the support plate 12, and the internal electrode for electrostatic adsorption 13 and the insulating material layer 14, that is, the thickness of the electrostatic chuck section 2 be greater than or equal to 1 mm and less than or equal to 10 mm. The reason is because, if the thickness of the electrostatic chuck section 2 is less than 1 mm, it is not possible to secure the mechanical strength of the electrostatic chuck section 2, and on the other hand, if the thickness of the electrostatic chuck section 2 exceeds 10 mm, the heat capacity of the electrostatic chuck section 2 becomes too large, and thus the thermal responsiveness of the plate-shaped sample W which is positioned is degraded and furthermore, it becomes difficult to maintain the in-plane temperature of the plate-shaped sample W at a desired temperature pattern due to an increase in heat transfer in a lateral direction of the electrostatic chuck section.

It is preferable that in particular, the thickness of the placement plate 11 be greater than or equal to 0.3 mm and less than or equal to 2.0 mm. The reason is because, if the thickness of the placement plate 11 is less than 0.3 mm, the risk of causing electrical discharge by the voltage applied to the internal electrode for electrostatic adsorption 13 is increased, and on the other hand, if the thickness of the placement plate 11 exceeds 2.0 mm, it is not possible to sufficiently adsorb and fix the plate-shaped sample W, and therefore, it becomes difficult to sufficiently heat the plate-shaped sample W.

The internal electrode for electrostatic adsorption 13 is used as an electrode for an electrostatic chuck for fixing the plate-shaped sample with an electrostatic adsorption force by generating electric charge, and the shape or the size thereof is appropriately adjusted according to the use thereof.

The internal electrode for electrostatic adsorption 13 is formed of a conductive ceramic such as an aluminum oxide-tantalum carbide ($Al_2O_3$—$Ta_4C_5$) conductive composite sintered body, an aluminum oxide-tungsten ($Al_2O_3$—W) conductive composite sintered body, an aluminum oxide-silicon carbide ($Al_2O_3$—SiC) conductive composite sintered body, an aluminum nitride-tungsten (AlN-W) conductive composite sintered body, an aluminum nitride-tantalum (AlN—Ta) conductive composite sintered body, or an yttrium oxide-molybdenum ($Y_2O_3$—Mo) conductive composite sintered body, or a high melting point metal such as tungsten (W), tantalum (Ta), or molybdenum (Mo).

The thickness of the internal electrode for electrostatic adsorption 13 is not particularly limited. However, it is preferable that the thickness of the internal electrode for electrostatic adsorption 13 be greater than or equal to 5 μm and less than or equal to 20 μm, and particularly preferably, the thickness be greater than or equal to 10 μm and less than or equal to 15 μm. The reason is because, if the thickness is less than 5 μm, it is not possible to secure sufficient electric conductivity, and on the other hand, if the thickness exceeds 20 μm, due to a difference in coefficient of thermal expansion between the internal electrode for electrostatic adsorption 13 and the placement plate 11 and between the internal electrode for electrostatic adsorption 13 and the support plate 12, cracks easily occur in joint interfaces between the internal electrode for electrostatic adsorption 13 and the placement plate 11 and between the internal electrode for electrostatic adsorption 13 and the support plate 12.

The internal electrode for electrostatic adsorption 13 having such a thickness can be easily formed by a film formation method such as a sputtering method or a vapor deposition method, or a coating method such as a screen printing method.

The insulating material layer 14 surrounds the internal electrode for electrostatic adsorption 13, thereby protecting the internal electrode for electrostatic adsorption 13 from a corrosive gas and plasma thereof and also joining and integrating a boundary portion between the placement plate 11 and the support plate 12, that is, an outer peripheral portion area other than the internal electrode for electrostatic adsorption 13, and is configured by an insulating material having the same composition or the same main component as those of materials configuring the placement plate 11 and the support plate 12.

The terminal for power feeding 15 is a rod-shaped terminal provided in order to apply direct-current voltage to the internal electrode for electrostatic adsorption 13, and as a material of the terminal for power feeding 15, if it is an electrically-conductive material having excellent heat resistance, there is no particular limitation. However, a material having a coefficient of thermal expansion close to the coefficients of thermal expansion of the internal electrode for electrostatic adsorption 13 and the support plate 12 is preferable, and for example, the conductive ceramic configuring the internal electrode for electrostatic adsorption 13, or a metal material such as tungsten (W), tantalum (Ta), molybdenum (Mo), niobium (Nb), or a Kovar alloy is suitably used.

The terminal for power feeding 15 is insulated from the base section for cooling 3 by an insulator 16 having insulation properties.

Then, the terminal for power feeding 15 is joined to and integrated with the support plate 12, and in addition, the placement plate 11 and the support plate 12 are joined to and integrated with each other by the internal electrode for electrostatic adsorption 13 and the insulating material layer 14, whereby the electrostatic chuck section 2 is configured.

The base section for cooling 3 is for cooling the electrostatic chuck section 2, thereby maintaining the electrostatic chuck section 2 at a desired temperature, and has the form of a disk with a thickness.

As the base section for cooling 3, for example, a water-cooled base or the like in which a flow path 31 for circulating water is formed inside thereof is suitable.

As a material configuring the base section for cooling 3, if it is a metal having excellent thermal conductivity, electric conductivity, and workability, or a composite material that includes the metal, there is no particular limitation, and for example, aluminum (Al), an aluminum alloy, copper (Cu), a copper alloy, stainless steel (SUS), or the like is suitably used. It is preferable that at least the surface which is exposed to plasma, of the base section for cooling 3, be subjected to insulation treatment. As such insulation treatment, alumite treatment or insulating film treatment to apply an insulating film such as alumina is preferable.

The organic adhesive layer 4 is for bonding and integrating the electrostatic chuck section 2 bent such that the entirety has a concave surface shape with a central portion as a basal plane and the base section for cooling 3 while the upper end portion 21a of the annular projection portion 21 and the upper end portions 22a of the plurality of projection portions 22 maintain the shape and the position of the concave surface 23.

With respect to the thickness of the organic adhesive layer 4, since the electrostatic chuck section 2 is bent, it is necessary to make a central portion thin and make a peripheral border portion thick, and for example, the central portion is made to be greater than or equal to 0 μm and less than or equal to 80 μm and the peripheral border portion is made to be greater than or equal to 90 μm and less than or equal to 100 μm.

In this way, it is possible to sufficiently retain the adhesive strength between the electrostatic chuck section 2 and the base section for cooling 3, and in addition, it is possible to sufficiently secure the thermal conductivity between the electrostatic chuck section 2 and the base section for cooling 3.

The organic adhesive layer 4 is formed of, for example, a cured body obtained by heating and curing a silicone-based resin composition, or acrylic resin.

The silicone-based resin composition is a resin having excellent heat resistance and elasticity and is a silicon compound having a siloxane bond (Si—O—Si). The silicone-based resin composition can be expressed by, for example, the following chemical formula (1) or (2).

Chemical formula 1

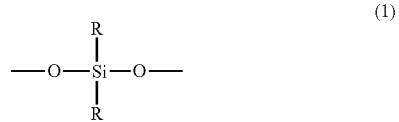

(1)

In this formula, R is H or an alkyl group ($C_nH_{2n+1}$—: n is an integer).

Chemical formula 2

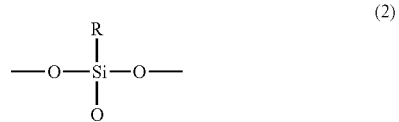

(2)

In this formula, R is H or an alkyl group ($C_nH_{2n+1}$—: n is an integer).

As such a silicone-based resin composition, a silicone resin having a thermal curing temperature in a range of 70° C. to 140° C. is particularly preferable.

Here, if the thermal curing temperature is less than 70° C., curing does not sufficiently proceed in a joining process when joining the electrostatic chuck section 2 and the base section for cooling 3 in a state of being opposed, and thus workability is inferior, and therefore, it is not preferable. On the other hand, if the thermal curing temperature exceeds 140° C., a difference in thermal expansion between the electrostatic chuck section 2 and the base section for cooling 3 is large, stress between the electrostatic chuck section 2 and the base section for cooling 3 increases, and thus there is a concern that peeling-off may occur between the electrostatic chuck section 2 and the base section for cooling 3, and therefore, it is not preferable.

As the silicone resin, a resin in which Young's modulus after curing is less than or equal to 8 MPa is preferable. Here, if Young's modulus after curing exceeds 8 MPa, when a thermal cycle of temperature increase and temperature decrease is applied to the organic adhesive layer 4, it is not possible to absorb a difference in thermal expansion between the electrostatic chuck section 2 and the base section for cooling 3, and the durability of the organic adhesive layer 4 is reduced, and therefore, it is not preferable.

It is preferable that fillers having an average particle size of greater than or equal to 1 μm and less than or equal to 10 μm and made of an inorganic oxide, an inorganic nitride, or an inorganic oxynitride, for example, surface-coated aluminum nitride (AlN) particles, in which a coating layer made of silicon oxide ($SiO_2$) is formed on the surface of aluminum nitride (AlN) particles, be contained in the organic adhesive layer 4.

The surface-coated aluminum nitride (AlN) particles are mixed in order to improve the thermal conductivity of the silicone resin, and by adjusting the mixing ratio thereof, it is possible to control the heat transfer coefficient of the organic adhesive layer 4.

That is, by increasing the mixing ratio of the surface-coated aluminum nitride (AlN) particles, it is possible to increase the heat transfer coefficient of an organic adhesive configuring the organic adhesive layer 4.

Further, since the coating layer made of silicon oxide ($SiO_2$) is formed on the surface of the aluminum nitride (AlN) particles, the surface-coated aluminum nitride (AlN) particles have excellent water resistance, compared to simple aluminum nitride (AlN) particles to which surface coating is not applied. Therefore, it is possible to secure the durability of the organic adhesive layer 4 containing the silicone-based resin composition as a main component thereof, and as a result, it is possible to dramatically improve the durability of the electrostatic chuck device 1.

Further, in the surface-coated aluminum nitride (AlN) particles, the surface of the aluminum nitride (AlN) particles is coated by the coating layer made of silicon oxide ($SiO_2$) having excellent water resistance, and therefore, there is no concern that the aluminum nitride (AlN) may be hydrolyzed by water in the atmosphere and there is also no concern that the heat transfer coefficient of the aluminum nitride (AlN) may be reduced, and thus the durability of the organic adhesive layer 4 is improved.

In addition, there is also no concern that the surface-coated aluminum nitride (AlN) particles may become a source of contamination to the plate-shaped sample W such as a semiconductor wafer, and also in this regard, it can be said that the surface-coated aluminum nitride (AlN) particles are a preferable filler.

Further, the organic adhesive layer 4 may be formed of a thermosetting acrylic resin adhesive having a Young's modulus of less than or equal to 1 GPa and flexibility (Shore hardness is less than or equal to A100). In this case, the filler may be contained or may not be contained.

Next, a method of manufacturing the electrostatic chuck device 1 will be described.

First, a pair of plate-shaped bodies which becomes the placement plate 11 and the support plate 12 is fabricated by an aluminum oxide-silicon carbide ($Al_2O_3$—SiC) composite sintered body or an yttrium oxide ($Y_2O_3$) sintered body.

For example, by molding a powder mix which includes silicon carbide powder and aluminum oxide powder, or yttrium oxide powder into a desired shape and then performing firing for a predetermined time at a temperature in a range of 1400° C. to 2000° C. and in a non-oxidizing atmosphere, preferably, an inert atmosphere, it is possible to obtain the pair of plate-shaped bodies.

Subsequently, a plurality of fixing holes for fitting and holding the terminals for power feeding 15 are formed in the plate-shaped body on one side, and the terminals for power feeding 15 are fixed to the fixing holes.

Subsequently, an application liquid for formation of an internal electrode for electrostatic adsorption, in which a conducting material such as the above-described conductive ceramic is dispersed in an organic solvent, is applied onto a predetermined area of the surface of the plate-shaped body with the terminals for power feeding 15 fitted therein, so as to come into contact with the terminals for power feeding 15, and drying is then performed, whereby a layer for forming an internal electrode for electrostatic adsorption is formed, and in addition, an insulating material layer that includes a powder material having the same composition or the same main component as the plate-shaped body is formed on an area other than the area with the layer for forming an internal electrode for electrostatic adsorption formed thereon, on the plate-shaped body.

Subsequently, the plate-shaped body on the other side is superimposed on the layer for forming an internal electrode for electrostatic adsorption and the insulating material layer on the plate-shaped body on one side and the plate-shaped bodies are then integrated with each other by performing hot pressing at a high temperature and high pressure. It is preferable that an atmosphere in the hot pressing be a vacuum or an inert atmosphere such as Ar, He, or $N_2$.

Further, it is preferable that the pressure at the time of uniaxial pressing in the hot pressing be in a range of 5 MPa to 10 MPa, and it is preferable that the temperature in the hot pressing be in a range of 1400° C. to 1850° C.

Due to the hot pressing, the layer for forming an internal electrode for electrostatic adsorption is fired, thereby being turned into the internal electrode for electrostatic adsorption 13 made of a conductive composite sintered body, and at the same time, these plate-shaped bodies become the placement plate 11 and the support plate 12, and the internal electrode for electrostatic adsorption 13 and the insulating material layer 14 are joined to and integrated with each other, whereby an electrostatic chuck is obtained.

Subsequently, spacers having a plurality of heights are respectively fixed to predetermined areas on the base section for cooling 3.

Here, the heights and the positions of the spacers are set such that upper end portions of the spacers form the same shape as the concave surface 23 toward the peripheral border portion from the central portion on the base section for cooling 3.

Subsequently, an adhesive made of a silicone-based resin composition is applied. The application quantity of the adhesive is adjusted such that the electrostatic chuck and the base section for cooling 3 are joined to and integrated with each other in a state of retaining a desired shape by the spacers.

As a method of applying the adhesive, in addition to manual application using a spatula or the like, a bar coating method, a screen printing method, or the like can be given.

After the application, the electrostatic chuck and the base section for cooling 3 having the silicone-based resin composition and the spacers are overlapped.

Further, the terminal for power feeding 15 provided to be erect and the insulator 16 are inserted and fitted in a power feed terminal accommodating hole (not shown) perforated in the base section for cooling 3.

Subsequently, the electrostatic chuck is pressed against the base section for cooling 3 with predetermined pressure so as to be pushed in until the central portion of the bottom surface of the electrostatic chuck comes into close contact with the upper surface of the base section for cooling 3, and extruded excess adhesive is removed.

In this way, the electrostatic chuck is bent, and thus the electrostatic chuck section 2 with the concave surface 23 in which a portion that is located at the central portion becomes a basal plane formed therein is obtained.

Subsequently, machining such as blasting is performed on predetermined positions of the upper surface of the placement plate 11 of the electrostatic chuck section 2, thereby forming the annular projection portion 21 and the plurality of projection portions 22 and making a bottom surface portion excluding the annular projection portion 21 and the plurality of projection portions 22 be the surface 11a of the placement plate 11.

By the above, the electrostatic chuck section 2 and the base section for cooling 3 are joined to and integrated with each other through the organic adhesive layer 4, and thus the electrostatic chuck device 1 of this embodiment is obtained in which the annular projection portion 21 and the plurality of projection portions 22 are formed on the surface 11a of the placement plate 11 of the electrostatic chuck section 2.

According to the electrostatic chuck device 1 of this embodiment, the annular projection portion 21 is provided at the peripheral border portion on the surface 11a of the placement plate 11, the plurality of projection portions 22 each having the same height as the height of the annular projection portion 21 are provided in an area surrounded by the annular projection portion 21 on the surface 11a, and the upper end portion 21a of the annular projection portion 21 and the upper end portion 22a of each of the plurality of projection portions 22 are located on the concave surface 23 with the central portion of the surface 11a as a basal plane, and therefore, there is no concern that the plate-shaped sample W may be deformed when adsorbing the plate-shaped sample W or when detaching the plate-shaped sample W, and it is possible to uniformize the temperature of the plate-shaped sample W.

Further, since the plate-shaped sample W is supported in a close contact state by the upper end portion 21a of the annular projection portion 21 and the upper end portion 22a of each of the plurality of projection portions 22, there is no concern that a contact surface between the upper end portions 21a and 22a and the plate-shaped sample W may be scraped, and thus it is possible to make it difficult for particles to be produced.

Further, since the height $h_1$ from the surface 11a to the upper end portion 21a of the annular projection portion 21 and the height $h_2$ from the surface 11a to the upper end portion 22a of each of the plurality of projection portions 22 are set to be the same, it is possible to make the depths of the flow paths, which make the medium for sealing such as nitrogen gas or helium gas flow therein, surrounded by the annular projection portion 21 and the plurality of projection portions 22 on the surface 11a constant, and thus it is possible to make the heat transfer in the flow paths of the medium for sealing constant, and it is possible to uniformize the temperature of the plate-shaped sample W, and thus it is possible to stably generate plasma.

Further, since the thickness of the organic adhesive layer 4 is set so as to be thin at the central portion and to thick at the outer peripheral portion, heat transfer at the central portion is not reduced, and it is possible to relieve stress at the outer peripheral portion where stress due to a difference in thermal expansion becomes large.

In addition, in the electrostatic chuck device 1 of this embodiment, the electrostatic chuck section 2 in which the concave surface 23 in which a portion that is located at the central portion becomes a basal plane is formed is obtained by bending the electrostatic chuck by overlapping the electrostatic chuck and the base section for cooling 3 having the silicone-based resin composition and the spacers and subsequently, pressing the electrostatic chuck against the base section for cooling 3 with predetermined pressure so as to be pushed in until the central portion of the bottom surface of the electrostatic chuck comes into close contact with the upper surface of the base section for cooling 3. However, an electrostatic chuck section in which a surface having a V-shaped cross-section in which a portion that is located at the central portion becomes a basal plane is formed may be obtained by setting the heights and the positions of the spacers such that a V-shaped cross-section is formed by heightening the upper end portions of the spacers toward the peripheral border portion from the central portion on the base section for cooling 3, subsequently, applying an adhesive made of a silicone-based resin composition, thereafter, overlapping the electrostatic chuck and the base section for cooling 3 having the silicone-based resin composition and the spacers, and pressing the electrostatic chuck against the base section for cooling 3 with predetermined pressure so as to be pushed in until the central portion of the bottom surface of the electrostatic chuck comes into close contact with the upper surface of the base section for cooling 3.

Figure 3:
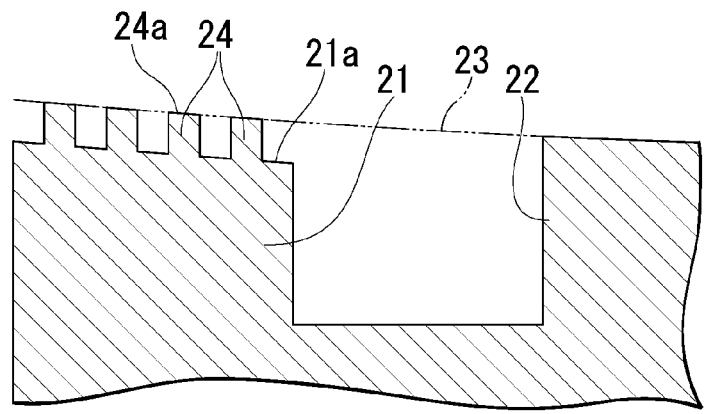
FIG. 3 is a partially enlarged cross-sectional view showing an example in which minute projection portions are provided at an upper end portion of an annular projection portion and which is a modified example of the electrostatic chuck device according to the first embodiment of the present invention.

Further, as shown in FIG. 3, a configuration may be made in which one or more minute projection portions 24 are provided on the upper end portion 21a of the annular projection portion 21 by machining such as blasting and an upper end portion 24a of the minute projection portion 24 and the upper end portion 22a of each of the plurality of projection portions 22 are newly located on the concave surface 23, the basal plane of which is located at the center point of the surface 11a.

In this way, it is possible to make the medium for sealing flow in areas excluding the minute projection portions 24 of the upper end portion 21a of the annular projection portion 21, and thus it is possible to uniformize the temperature of the outermost peripheral portion of the plate-shaped sample W.

[Second Embodiment]

Figure 4:
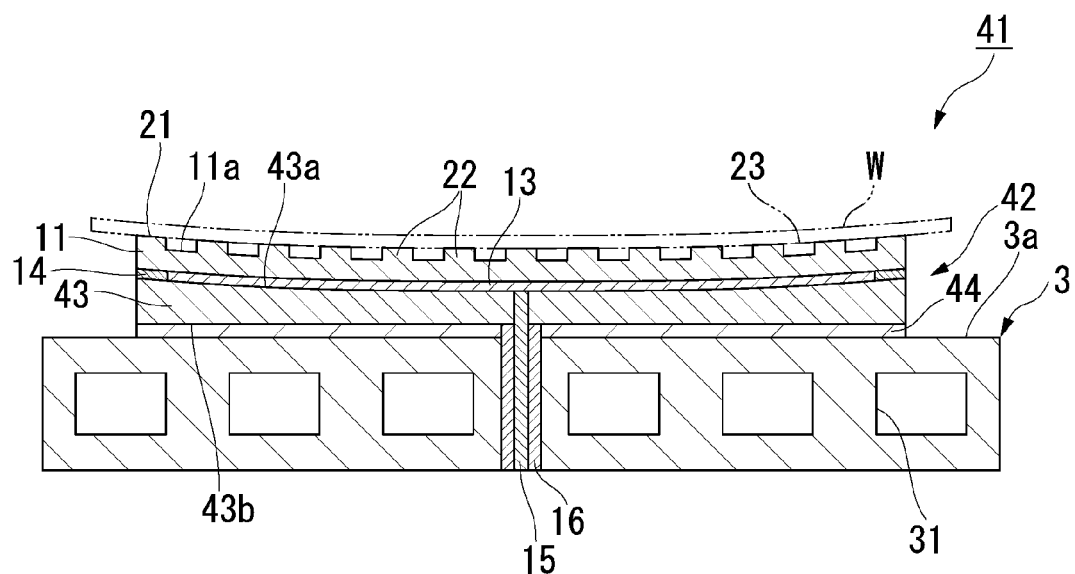
FIG. 4 is a cross-sectional view showing an electrostatic chuck device according to a second embodiment of the present invention.

FIG. 4 is a cross-sectional view showing an electrostatic chuck device according to a second embodiment of the present invention, and an electrostatic chuck device 41 of this embodiment is different from the electrostatic chuck device 1 of the first embodiment in that in the electrostatic chuck device 1 of the first embodiment, the electrostatic chuck in which the placement plate 11, the support plate 12, the internal electrode for electrostatic adsorption 13, and the insulating material layer 14 are joined to and integrated with each other is subjected to bending work so as to have the concave surface 23 in which a portion that is located at the central portion becomes a basal plane, and the obtained electrostatic chuck section 2 and the base section for cooling 3 are joined to and integrated with each other through the organic adhesive layer 4 in a state where the central portion of the bottom surface of the electrostatic chuck section 2 comes into close contact with the upper surface of the base section for cooling 3, whereas in the electrostatic chuck device 41 of this embodiment, machining is performed only on an upper surface 43a of a support plate 43 of an electrostatic chuck section 42 such that a concave surface in which a portion that is located at the central portion becomes a basal plane is formed, and a lower surface 43b is made to be a flat surface, and the electrostatic chuck section 42 and the base section for cooling 3 are bonded to and integrated with each other by an organic adhesive layer 44 having a uniform thickness.

Since a material or the like of the support plate 43 is just the same as that of the support plate 12 of the first embodiment and components or the like of the organic adhesive layer 44 are just the same as that of the organic adhesive layer 4 of the first embodiment, description thereof is omitted here.

The electrostatic chuck device 41 of this embodiment can be obtained by forming a concave surface in which a portion that is located at the central portion becomes a basal plane, only on the upper surface 43a of the support plate 43 by machining, fabricating the electrostatic chuck section 42 by using the support plate 43 with the concave surface formed therein, by the same method as in the first embodiment, bonding and integrating the electrostatic chuck section 42 and the base section for cooling 3 by the organic adhesive layer 44 having a uniform thickness, subsequently, forming the annular projection portion 21 and the plurality of projection portions 22 at predetermined positions of the upper surface of the placement plate 11 of the electrostatic chuck section 42 by the same method as in the first embodiment, and making the upper end portion 21a of the annular projection portion 21 and the upper end portion 22a of each of the plurality of projection portions 22 be located on the concave surface 23, the basal plane of which is located at the center point of the surface 11a.

Also in the electrostatic chuck device 41 of this embodiment, it is possible to exhibit the same operation and effects as those of the electrostatic chuck device 1 of the first embodiment.

In addition, since the electrostatic chuck section 42 and the base section for cooling 3 are bonded to and integrated with each other by the organic adhesive layer 44 having a uniform thickness, the thickness of the organic adhesive layer 44 at the outer peripheral portion becomes constant, and thus it is possible to increase heat transfer in the outer peripheral portion.

In addition, machining is performed only on the upper surface 43a of the support plate 43 of the electrostatic chuck section 42 so as to have the concave surface in which a portion that is located at the same central portion as that of the placement plate 11 becomes a basal plane, and the electrostatic chuck section 42 and the base section for cooling 3 are bonded to and integrated with each other by the organic adhesive layer 44 having a uniform thickness, and therefore, compared to performing bending work on the electrostatic chuck section 2 itself, it is possible to simplify a process and it is also possible to reduce manufacturing costs.

Also in the electrostatic chuck device 41 of this embodiment, similar to the electrostatic chuck device 1 of the first embodiment, a configuration may be made in which one or more minute projection portions are provided on the upper end portion 21a of the annular projection portion 21 by machining such as blasting and an upper end portion of the minute projection portion and the upper end portion 22a of each of the plurality of projection portions 22 are newly located on the concave surface 23.

[Third Embodiment]

Figure 5:
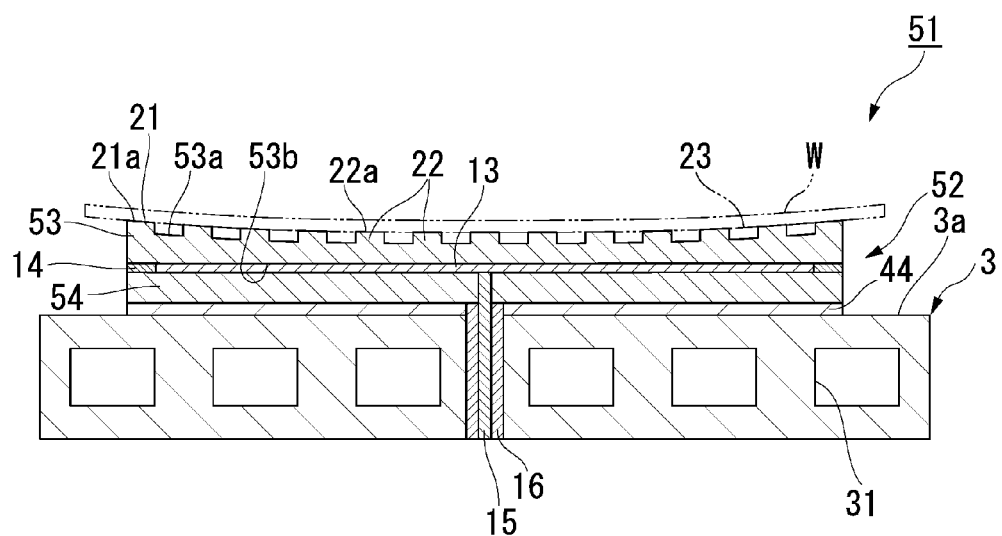
FIG. 5 is a cross-sectional view showing an electrostatic chuck device according to a third embodiment of the present invention.

FIG. 5 is a cross-sectional view showing an electrostatic chuck device according to a third embodiment of the present invention, and an electrostatic chuck device 51 of this embodiment is different from the electrostatic chuck device 1 of the first embodiment in that the annular projection portion 21 and the plurality of projection portions 22 are provided on a front surface (one principal surface) 53a of a placement plate 53 of an electrostatic chuck section 52, similar to the placement plate 11 of the second embodiment, the upper end surfaces of these projection portions are made so as to be located on the concave surface 23, a back surface (the other principal surface) 53b is made to be a flat surface, the internal electrode for electrostatic adsorption 13 and the insulating material layer 14 are provided between the placement plate 53 and a support plate 54 made of a plate-shaped body having a uniform thickness, and the electrostatic chuck section 52 and the base section for cooling 3 are bonded to and integrated with each other by the organic adhesive layer 44 having a uniform thickness.

Since materials or the like of the placement plate 53 and the support plate 54 are just the same as that of the support plate 12 of the first embodiment and components or the like of the organic adhesive layer 44 are just the same as that of the organic adhesive layer 4 of the first embodiment, description thereof is omitted here.

The electrostatic chuck device 51 of this embodiment can be obtained by forming a concave surface in which a portion that is located at the central portion becomes a basal plane, only on the surface 53a of the placement plate 53 by machining, fabricating the electrostatic chuck section 52, in which the internal electrode for electrostatic adsorption 13 and the insulating material layer 14 are provided between the placement plate 53 and the support plate 54, by using the placement plate 53 with the concave surface formed therein and the support plate 54 made of a plate-shaped body having a uniform thickness, by the same method as in the first embodiment, bonding and integrating the electrostatic chuck section 52 and the base section for cooling 3 by the organic adhesive layer 44 having a uniform thickness, subsequently, forming the annular projection portion 21 and the plurality of projection portions 22 at predetermined positions of the upper surface of the placement plate 53 of the electrostatic chuck section 52 by the same method as in the first embodiment, and making the upper end portion 21a of the annular projection portion 21 and the upper end portion 22a of each of the plurality of projection portions 22 be located on the concave surface 23, the basal plane of which is located at the center point of the front surface 53a.

Also in the electrostatic chuck device 51 of this embodiment, it is possible to exhibit the same operation and effects as those of the electrostatic chuck device 1 of the first embodiment.

In addition, the electrostatic chuck section 52, in which the internal electrode for electrostatic adsorption 13 and the insulating material layer 14 are provided between the placement plate 53 and the support plate 54 made of a plate-shaped body having a uniform thickness, and the base section for cooling 3 are bonded to and integrated with each other by the organic adhesive layer 44 having a uniform thickness, and therefore, the thicknesses of the internal electrode for electrostatic adsorption 13, the insulating material layer 14, and the organic adhesive layer 44 become constant, and thus it is possible to increase heat transfer in the outer peripheral portion.

In addition, machining is performed only on the surface 53a of the placement plate 53 of the electrostatic chuck section 52 so as to have a concave surface in which a portion that is located at the same central portion as that of the placement plate 53 becomes a basal plane, the support plate 54 is made to be a plate-shaped body having a uniform thickness, and the electrostatic chuck section 52 and the base section for cooling 3 are bonded to and integrated with each other by the organic adhesive layer 44 having a uniform thickness, and therefore, compared to performing bending work on the electrostatic chuck section 2 itself, it is possible to simplify a process and it is also possible to reduce manufacturing costs.

Also in the electrostatic chuck device 51 of this embodiment, similar to the electrostatic chuck device 1 of the first embodiment, a configuration may be made in which one or more minute projection portions are provided on the upper end portion 21a of the annular projection portion 21 by machining such as blasting and an upper end portion of the minute projection portion and the upper end portion 22a of each of the plurality of projection portions 22 are newly located on the concave surface 23.

EXAMPLES

Hereinafter, the present invention will be specifically described using examples and comparative examples. However, the present invention is not limited by these examples.

Example 1

Fabrication of Electrostatic Chuck Device

An electrostatic chuck section with an internal electrode for electrostatic adsorption having a thickness of 10 µm embedded inside was fabricated by a known method.

A placement plate of the electrostatic chuck section was an aluminum oxide-silicon carbide composite sintered body containing 8.5% by mass of silicon carbide and had the form of a disk having a diameter of 450 mm and a thickness of 4.0 mm.

Further, a support plate was also an aluminum oxide-silicon carbide composite sintered body containing 8.5% by mass of silicon carbide and had the form of a disk having a diameter of 450 mm and a thickness of 4.0 mm, similar to the placement plate.

Subsequently, the electrostatic chuck section was fabricated by joining and integrating the placement plate and the support plate, and thereafter, polishing was performed such that the thickness of the entirety of the electrostatic chuck section was 1.0 mm and the surface of the placement plate became a flat surface.

Subsequently, the surface of the placement plate was polished to a flat surface, and subsequently, blasting was performed on the surface, whereby an annular projection portion having a width of 500 µm and a height of 30 µm was formed at a peripheral border portion of the surface and a plurality of projection portions of a columnar shape having a diameter of 500 µm and a height of 40 µm were formed in an area surrounded by the annular projection portion of the surface. In this way, areas excavated by the blasting of the surface, that is, areas excluding the annular projection portion and the plurality of projection portions became flow paths for a medium for sealing.

On the other hand, a base section for cooling made of aluminum and having a diameter of 400 mm and a height of 30 mm was fabricated by machining. A flow path for circulating a refrigerant was formed in the inside of the base section for cooling.

Further, a plurality of first spacers of a rectangular columnar shape having a width of 2.0 μm, a length of 2.0 μm, and a height of 50 μm, a plurality of second spacers of a rectangular columnar shape having a width of 2.0 μm, a length of 2.0 μm, and a height of 75 μm, and a plurality of third spacers of a rectangular columnar shape having a width of 2.0 μm, a length of 2.0 μm, and a height of 100 μm were made of an aluminum oxide sintered body.

Subsequently, the plurality of first spacers having a rectangular columnar shape were fixed at regular intervals to positions of a circular shape having a diameter of 75 mm and centered on the center point of a joining surface to the electrostatic chuck section of the base section for cooling, the plurality of second spacers having a rectangular columnar shape were fixed at regular intervals to positions of a circular shape having a diameter of 150 mm and centered on the center point of the joining surface, and the plurality of third spacers having a rectangular columnar shape were fixed at regular intervals to positions of a circular shape having a diameter of 290 mm and centered on the center point of the joining surface.

Subsequently, a silicone resin-based adhesive that is an organic adhesive was applied onto the joining surface of the base section for cooling with the first to third spacers fixed thereto, and the support plate of the electrostatic chuck section was brought into close contact with the silicone resin-based adhesive.

Subsequently, the entirety of the electrostatic chuck section was deformed into an arcuate cross-sectional shape by making the support plate of the electrostatic chuck section approach the upper surfaces of the first to third spacers and pressing the electrostatic chuck section against the base section for cooling with a pressure of 60 kg, and thus the upper end surface of the annular projection portion and the upper end surface of each of the plurality of projection portions of the electrostatic chuck section were located on a concave surface having a radius of curvature R of 75000 mm, whereby an electrostatic chuck device of Example 1 was obtained.

(Evaluation)

Each of (1) an in-plane temperature characteristic of a silicon wafer, (2) the amount of leakage of gas, and (3) an adsorption characteristic of a silicon wafer of the electrostatic chuck device was evaluated.

(1) In-Plane Temperature Characteristic of Silicon Wafer

A silicon wafer having a diameter of 300 mm was electrotatically adsorbed to the placement surface of the electrostatic chuck section, and while cooling water of 30° C. was circulated in the flow path of the base section for cooling, an in-plane temperature distribution of the silicon wafer at this time was measured using a Thermography TVS-200EX (manufactured by Nippon Avionics Co., Ltd.). As a result, it was found that the in-plane temperature of the silicon wafer was favorably controlled within a range of ±3.5° C.

(2) Amount of Leakage of Gas

A silicon wafer having a diameter of 300 mm was electrotatically adsorbed to the placement surface of the electrostatic chuck section, and while cooling water of 30° C. was circulated in the flow path of the base section for cooling, inert gas was applied to the silicon wafer at this time and the in-plane thereof with pressure of 40 Torr and a leakage quantity of the inert gas was measured.

As a result, it was found that the amount of leakage of the gas was 2 Sccm and the amount of leakage was small.

(3) Adsorption Characteristic of Silicon Wafer

A silicon wafer having a diameter of 40 mm was electrotatically adsorbed to the placement surface of the electrostatic chuck section, a direct-current voltage of 2.0 kV was applied to the placement surface of the electrostatic chuck section while circulating cooling water of 30° C. in the flow path of the base section for cooling, and measurement was performed using a probe method.

As a result, the adsorption force of the silicon wafer fixed to the placement surface of the electrostatic chuck section was 0.25 MPa.

Example 2

Fabrication of Electrostatic Chuck Device

An electrostatic chuck section with an internal electrode for electrostatic adsorption having a thickness of 10 μm embedded inside was fabricated by a known method.

A placement plate of the electrostatic chuck section was an aluminum oxide-silicon carbide composite sintered body containing 8.5% by mass of silicon carbide and had the form of a disk having a diameter of 450 mm and a thickness of 4.0 mm.

Further, a support plate was also an aluminum oxide-silicon carbide composite sintered body containing 8.5% by mass of silicon carbide and had the form of a disk having a diameter of 450 mm and a thickness of 4.0 mm, similar to the placement plate.

Subsequently, the electrostatic chuck section was fabricated by joining and integrating the placement plate and the support plate, and thereafter, polishing was performed such that the thickness of the entirety of the electrostatic chuck section was 1.0 mm and the entire surface of the placement plate of the electrostatic chuck section became a concave surface having a radius of curvature R of 75000 mm.

Subsequently, blasting was performed on the surface processed into the concave surface shape, whereby an annular projection portion having a width of 500 μm and a height of 40 μm was formed at a peripheral border portion of the surface and a plurality of projection portions of a columnar shape having a diameter of 500 μm and a height of 30 μm were formed in an area surrounded by the annular projection portion of the surface. In this way, areas excavated by the blasting of the surface, that is, areas excluding the annular projection portion and the plurality of projection portions became flow paths for a medium for sealing.

On the other hand, a base section for cooling made of aluminum and having a diameter of 400 mm and a height of 30 mm was fabricated by machining. A flow path for circulating a refrigerant was formed in the inside of the base section for cooling.

Subsequently, a silicone resin-based adhesive that is an organic adhesive was applied onto the joining surface of the base section for cooling and the support plate of the electrostatic chuck section was brought into close contact with the silicone resin-based adhesive.

Subsequently, the electrostatic chuck section was bonded to the base section for cooling by pressing the electrostatic chuck section against the base section for cooling with a pressure of 60 kg, whereby an electrostatic chuck device of Example 2 was obtained.

(Evaluation)

Each of (1) an in-plane temperature characteristic of a silicon wafer, (2) the amount of leakage of gas, and (3) an adsorption characteristic of a silicon wafer of the electrostatic chuck device was evaluated according to Example 1.

As a result, it was found that the in-plane temperature of the silicon wafer was favorably controlled within a range of ±3.5° C.

Further, it was found that the amount of leakage of gas was 0.5 Sccm and the amount of leakage was very small.

Further, the adsorption force of the silicon wafer fixed to the placement surface of the electrostatic chuck section was 0.25 MPa.

Comparative Example 1

Fabrication of Electrostatic Chuck Device

An electrostatic chuck device was fabricated according to Example 1.

The placement plate of the electrostatic chuck section had the form of a disk having a diameter of 450 mm and a thickness of 4.0 mm, the support plate had the form of a disk having a diameter of 450 mm and a thickness of 4.0 mm, and the thickness of the entirety of the electrostatic chuck section obtained by joining and integrating the placement plate and the support plate was 1.0 mm.

Subsequently, blasting was performed on the surface of the placement plate, whereby an annular projection portion having a width of 500 μm and a height of 40 μm was formed at a peripheral border portion of the surface and a plurality of projection portions of a columnar shape having a diameter of 500 μm and a height of 30 μm were formed in an area surrounded by the annular projection portion of the surface. In this way, areas excavated by the blasting of the surface, that is, areas excluding the annular projection portion and the plurality of projection portions were flattened and became flow paths for a medium for sealing.

On the other hand, a base section for cooling was fabricated according to Example 1.

Subsequently, a silicone resin-based adhesive that is an organic adhesive was applied onto the joining surface of the base section for cooling and the support plate of the electrostatic chuck section was brought into close contact with the silicone resin-based adhesive.

Subsequently, the electrostatic chuck section was bonded to the base section for cooling by pressing the electrostatic chuck section against the base section for cooling with a pressure of 60 kg, whereby an electrostatic chuck device of Comparative Example 1 was obtained.

(Evaluation)

Each of (1) an in-plane temperature characteristic of a silicon wafer, (2) the amount of leakage of gas, and (3) an adsorption characteristic of a silicon wafer of the electrostatic chuck device was evaluated according to Example 1.

As a result, the in-plane temperature of the silicon wafer was ±4° C. and a difference in in-plane temperature was large in comparison with the electrostatic chuck devices of Examples 1 and 2.

Further, the amount of leakage of gas was 3 Sccm and was large in comparison with the electrostatic chuck devices of Examples 1 and 2.

Further, the adsorption force of the silicon wafer fixed to the placement surface of the electrostatic chuck section was 0.2 MPa.

Comparative Example 2

Fabrication of Electrostatic Chuck Device

An electrostatic chuck device was fabricated according to Example 1.

The placement plate of the electrostatic chuck section had the form of a disk having a diameter of 450 mm and a thickness of 4.0 mm, and the support plate had the form of a disk having a diameter of 450 mm and a thickness of 4.0 mm. Then, after the placement plate and the support plate were joined to and integrated with each other, polishing was performed such that the thickness of the entirety of the electrostatic chuck section was 1.0 mm and the entire surface of the placement plate of the electrostatic chuck section became a concave surface having a radius of curvature R of 75000 mm.

Subsequently, blasting was performed on the surface processed into the concave surface shape, whereby an annular projection portion having a width of 500 μm and a height of 40 μm was formed at a peripheral border portion of the surface and a plurality of projection portions of a columnar shape having a diameter of 500 μm and a height in a range of 30 μm to 35 μm were formed in an area surrounded by the annular projection portion of the surface. In this way, the upper end surface of the annular projection portion and the upper end surface of each of the plurality of projection portions of the electrostatic chuck section were located on the concave surface having a radius of curvature R of 75000 mm and areas excavated by the blasting of the surface, that is, areas excluding the annular projection portion and the plurality of projection portions were flattened and became flow paths for a medium for sealing.

On the other hand, a base section for cooling was fabricated according to Example 1.

Subsequently, a silicone resin-based adhesive that is an organic adhesive was applied onto the joining surface of the base section for cooling and the support plate of the electrostatic chuck section was brought into close contact with the silicone resin-based adhesive.

Subsequently, the electrostatic chuck section was bonded to the base section for cooling by pressing the electrostatic chuck section against the base section for cooling with a pressure of 60 kg, whereby an electrostatic chuck device of Comparative Example 2 was obtained.

(Evaluation)

Each of (1) an in-plane temperature characteristic of a silicon wafer, (2) the amount of leakage of gas, and (3) an adsorption characteristic of a silicon wafer of the electrostatic chuck device was evaluated according to Example 1.

As a result, the in-plane temperature of the silicon wafer was ±5° C. and a difference in in-plane temperature was large in comparison with the electrostatic chuck devices of Examples 1 and 2.

Further, the amount of leakage of gas was 3 Sccm and was large in comparison with the electrostatic chuck devices of Examples 1 and 2.

Further, the adsorption force of the silicon wafer fixed to the placement surface of the electrostatic chuck section was 0.2 MPa.

According to the above evaluation results, in the electrostatic chuck devices of Examples 1 and 2, although with respect to the adsorption force of the silicon wafer, a difference was not very recognizable in comparison with the electrostatic chuck devices of Comparative Examples 1 and 2, it was found that the in-plane temperature of the silicon wafer was favorably controlled within a range of ±3.5° C. and the amount of leakage of gas was also as very small as less than or equal to 2 Sccm.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An electrostatic chuck device comprising:
an electrostatic chuck section which has a base material having one principal surface as a placement surface on which a plate-shaped sample is placed, and an internal electrode for electrostatic adsorption that electrostatically adsorbs the plate-shaped sample to the placement surface,
wherein an annular projection portion is provided at a peripheral border portion on the one principal surface, and a plurality of projection portions having the same height as the height of the annular projection portion are provided in an area surrounded by the annular projection portion on the one principal surface,
an upper end portion of the annular projection portion and upper end portions of the plurality of projection portions are located on a concave surface with a central portion of the one principal surface as a basal plane,
a base section for cooling is provided on the other principal surface side of the electrostatic chuck section, and
a difference between a height from one principal surface of the base section for cooling of the annular projection portion and a height from one principal surface of the base section for cooling of the projection portion which is located in the vicinity of the center of the area is greater than or equal to 1 μm and less than or equal to 30 μm.

2. The electrostatic chuck device according to claim 1, wherein the base material is made of a ceramic in which electrical resistivity is greater than or equal to $1\times10^{14}\Omega\cdot cm$ and a relative dielectric constant at a frequency of 20 Hz is greater than or equal to 13.

3. The electrostatic chuck device according to claim 2, wherein a particle size of the ceramic is less than or equal to 2 μm.

4. The electrostatic chuck device according to claim 1, wherein one or more minute projection portions are provided at the upper end portion of the annular projection portion.

5. An electrostatic chuck device comprising:
an electrostatic chuck section which has a base material having one principal surface as a placement surface on which a plate-shaped sample is placed, and an internal electrode for electrostatic adsorption that electrostatically adsorbs the plate-shaped sample to the placement surface,
wherein an annular projection portion is provided at a peripheral border portion on the one principal surface, and a plurality of projection portions having the same height as the height of the annular projection portion are provided in an area surrounded by the annular projection portion on the one principal surface,
an upper end portion of the annular projection portion and upper end portions of the plurality of projection portions are located on a concave surface with a central portion of the one principal surface as a basal plane, and
the sum of an area of the upper end portion of the annular projection portion and the total area of areas of the respective upper end portions of the plurality of projection portions is less than or equal to 30% of an area of the one principal surface.

6. The electrostatic chuck device according to claim 5, wherein the base material is made of a ceramic in which electrical resistivity is greater than or equal to $1\times10^{14}\Omega\cdot cm$ and a relative dielectric constant at a frequency of 20 Hz is greater than or equal to 13.

7. The electrostatic chuck device according to claim 6, wherein a particle size of the ceramic is less than or equal to 2 μm.

8. The electrostatic chuck device according to claim 1, wherein one or more minute projection portions are provided at the upper end portion of the annular projection portion.

* * * * *